United States Patent
White et al.

(10) Patent No.: US 7,109,766 B2
(45) Date of Patent: Sep. 19, 2006

(54) ADJUSTABLE FREQUENCY DELAY-LOCKED LOOP

(75) Inventors: Jeffrey B. White, Rolling Meadows, IL (US); Joseph A. Charaska, Melrose Park, IL (US); Manuel P. Gabato, Jr., Elmhurst, IL (US); Paul H. Gailus, Prospect Heights, IL (US); Robert E. Stengel, Pompano Beach, FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/830,337

(22) Filed: Apr. 22, 2004

(65) Prior Publication Data

US 2005/0237093 A1   Oct. 27, 2005

(51) Int. Cl.
*H03L 7/08* (2006.01)
(52) U.S. Cl. .................. 327/158; 327/159; 327/161
(58) Field of Classification Search ............ 327/158, 327/159, 161, 269, 270, 276, 277
See application file for complete search history.

(56) References Cited

U.S. PATENT DOCUMENTS

| | | | |
|---|---|---|---|
| 4,637,018 A * | 1/1987 | Flora et al. ............ 714/700 |
| 5,712,582 A * | 1/1998 | Yokota et al. ............ 327/156 |
| 6,125,157 A * | 9/2000 | Donnelly et al. ............ 375/371 |
| 6,353,649 B1 | 3/2002 | Bockleman et al. |
| 6,510,191 B1 * | 1/2003 | Bockelman ............ 375/371 |
| 6,642,800 B1 * | 11/2003 | Drapkin et al. ............ 331/16 |
| 6,891,420 B1 | 5/2005 | Martin et al. |

* cited by examiner

*Primary Examiner*—Timothy P. Callahan
*Assistant Examiner*—An T. Luu
(74) *Attorney, Agent, or Firm*—Valerie M. Davis

(57) ABSTRACT

A delay-locked loop 300 that includes: an adjustable frequency source (320) for generating a clock signal (322) having an adjustable frequency; an adjustment and tap selection controller (310) for determining a first frequency as a function of a second frequency and for causing the frequency source to adjust the frequency of the clock signal to substantially the first frequency, the second frequency being the desired frequency of a first output signal; a delay line (330) configured to receive the clock signal for generating a plurality of phase-shifted clock signals; and a first selection circuit (370) for receiving the plurality of phase-shifted clock signals and for selecting, one at a time and under the control of the adjustment and tap selection controller, a first sequence of the phase-shifted clock signals for generating the first output signal having substantially the second frequency.

23 Claims, 6 Drawing Sheets

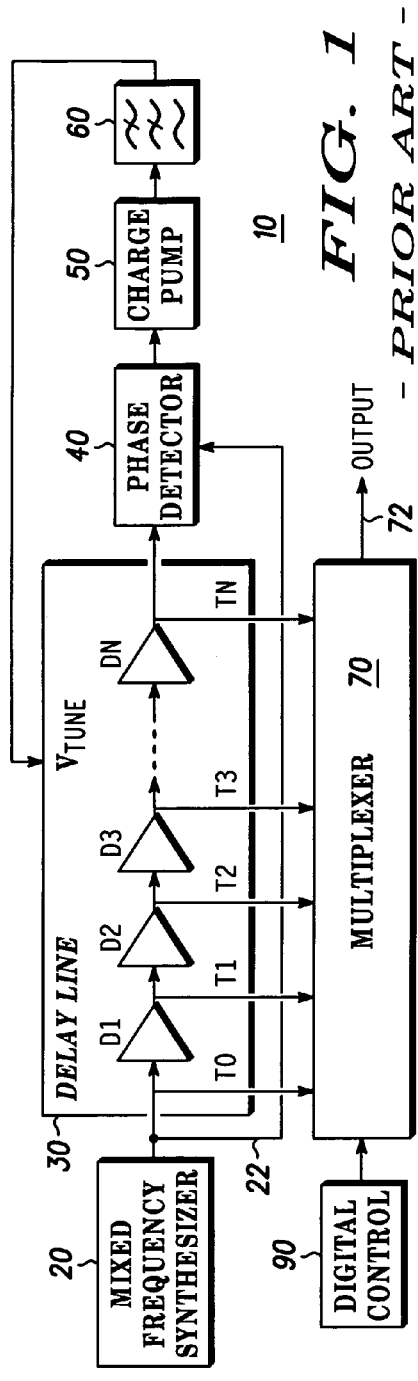
FIG. 1 - PRIOR ART -
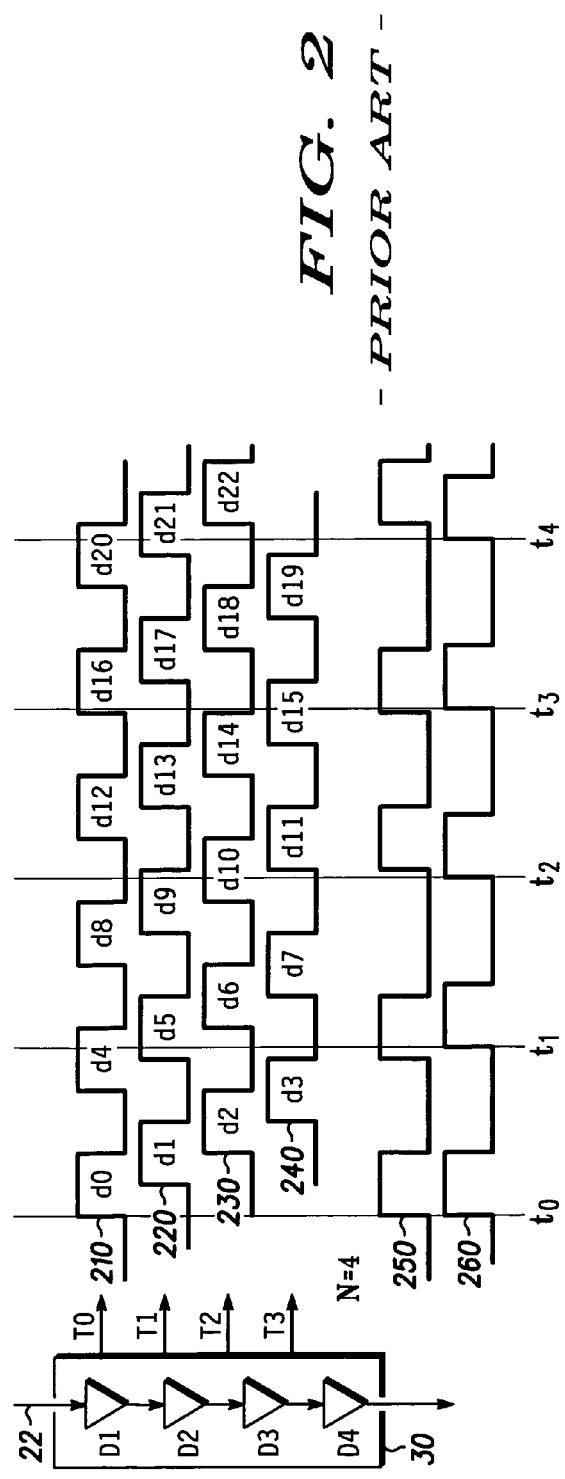
FIG. 2 - PRIOR ART -

ADJUSTABLE FREQUENCY DELAY-LOCKED LOOP

FIELD OF THE INVENTION

The present invention relates generally to direct digital frequency synthesis and more specifically to a delay-locked loop configuration for reducing spurious output signals.

BACKGROUND OF THE INVENTION

A number of devices, for instance mobile applications such as portable devices, require the use of a frequency synthesizer for operation. One such frequency synthesizer includes a digital-to-phase converter having a digital delay-locked loop (DLL). FIG. 1 illustrates a schematic diagram of a prior art DLL 10 configuration for generating an output signal 72 at a desired frequency $F_{out}$. DLL 10 comprises a fixed frequency synthesizer 20 for generating a clock signal 22 having a frequency of $F_{clk}$. DLL 10 further comprises: a delay line 30 having N number of adjustable delay elements D1 through DN; a phase detector 40, a charge pump 50 and a loop filter 60, which make up a stabilization circuit for DLL 10; a selection circuit 70 that may be, for instance, a multiplexer (also referred to herein as a "MUX"); and a digital control device 90.

In operation, delay line 30 receives the clock signal 22 into an input and then generates a set of time delayed clock signals at a plurality of outputs. The time delays are generated by delay elements D1 through DN, which are connected in cascade and which may be, for instance, inverter gates, transmission line gates, and the like, depending upon a desired DLL implementation. Moreover, an overall time delay between a signal at first point on the delay line, which is typically an input of the first delay element D1, and a signal at a second point on the delay line, which is typically the output of the Nth delay element DN, is controlled by a bias voltage $V_{tune}$ input into delay line 30. This overall delay may be, for instance, a wavelength (i.e., 360 degrees) which is 1 period of clock signal 22, a half wavelength (i.e., 180 degrees) which is ½ period of clock signal 22, or whatever delay is required for a particular application. Ideally, each delay element will replicate the input waveform, with a time delay, at the delay element output that is equal to the total delay from the input of delay element D1 through the output of delay element DN divided by the total number of delay elements (i.e., N).

Each delay element D1–DN has an output tap T1–TN, respectively, which is connected to an input of MUX 70. In addition, a tap T0 is connected between the input of the delay element D1 and an input of MUX 70 in order to supply the clock signal 22 thereto. Each delay element D1–DN delays the propagation of the clock signal 22 and outputs on its corresponding output tap T1–TN, respectively, a corresponding phase shifted clock signal. Accordingly, the number N of phase-shifted clock signals output by delay elements D1–DN are supplied via output taps T1–TN to the inputs of MUX 70 along with the clock signal 22 output on tap T0.

To ensure stability during operation, DLL 10 includes phase detector 40 that is typically connected to receive the clock signal 22 from synthesizer 20 and a phase shifted clock signal from delay line 30, which in this instance is the signal at the output of delay element DN. Phase detector 40 compares the phase difference between the clock signal 22 and the phase shifted clock signal to a predetermined desired phase shift and outputs to the charge pump an error signal that is a function of the result of this comparison. Those of ordinary skill in the art should realize that phase detector 40 could be configured for comparing the phase difference between the signals at any two points on the delay line to the predetermined desired phase shift and outputting the corresponding error signal.

The charge pump 50 deposits a corresponding charge on the loop filter 60, which in turn converts the error signal into a DLL tuning signal which is supplied to delay line 30 to adjust the bias voltage $V_{tune}$ in a manner that maintains the phase relationship between the phase shifted clock signal and the clock signal 22 during operation of DLL 10, i.e., until the total delay through the delay line is the desired delay. Once DLL 10 has stabilized, MUX 70 operates in a conventional way under the control of digital control 90 to connect, one at a time, a sequence of phase-shifted clock signals at taps T0–TN to corresponding outputs of MUX 70 to provide an output signal at the desired output frequency $F_{out}$. The digital control device 90 is typically a tap selection controller that comprises two accumulators, one to determine when to connect a tap to an output terminal and another to determine which tap to connect. This tap selection sequence is typically based on $F_{out}$, $F_{clk}$ and N.

There are a finite number of transitions that can be selected from the delay line 30 to create an output signal at a desired frequency. The possible error associated with the selection of a given tap to create the output signal causes a quantization effect which creates spurious signal outputs (spurious being undesired spectral components). The effect can be minimal if the selected frequency and the clock signal frequency happen to fall on certain values. However, in general the spurious free dynamic range will be limited by the quantization effect of the taps.

FIG. 2 illustrates the misalignment between the desired output signal transitions and those of the actual output signal 72 generated in DLL 10. This misalignment is caused by a round off error which results in spurious signals generated at the output 72 of MUX 70. Let us assume that delay line 30 includes four delay elements D1 through D4. FIG. 2, accordingly, illustrates clock signal 22 (i.e. waveform 210 having no time delay or a zero phase shift) and three corresponding time delayed or phase-shifted clock signals (i.e., waveforms 220, 230 and 240) output therefrom. Assuming a total delay from the input of D1 to the output of D4 is one wavelength, the waveform output from D4 would be equivalent to waveform 210. As FIG. 2 illustrates, each waveform ideally has the same frequency as the clock signal 22 (i.e., $F_{clk}$) but may have a different delay in time. Moreover, in this illustration from a time $t_0$ to a time $t_4$, twenty-two edge transition times or delay times (i.e., d0 through d21) are generated from which MUX 70 can select to generate the desired output waveform 260.

Given the number of taps, the frequency of the clock signal 22, and the desired output frequency, the potential delay times can be calculated by digital control device 90 and selected by MUX 70 to generate a corresponding output signal 250. This relationship may, for instance, be represented by the following equation:

$$F_{clk} = (M * F_{out})/N, \text{ for } M \geq N \quad (1)$$

where $F_{clk}$ is the frequency of the clock signal 22, $F_{out}$ is the desired output frequency, N is the number of taps and M represents the delays that would be required to generate the desired output signal waveform 260. This relationship may, alternatively, be represented by the following equation:

$$T_{out} = (M * T_{clk})/N, \text{ for } M \geq N \quad (2)$$

where M and N are the same as in equation (1), $T_{clk}$ is the period of $F_{clk}$, $T_{out}$ is the period of $F_{out}$ and $T_{clk}/N$ represents a delay caused by a single delay element. Ideally, to generate an output signal having no spurious signals, M would equal an integer number of delays (i.e., delays=$T_{clk}/N$). However, typically this is not the case. Generally, M is a non-integer multiple of delays and taps are then selected above and below the desired multiple of delays thereby generating a waveform 250 that has the desired output period on average.

Referring again to FIG. 2, assume that M=5.4, for example, for a given $T_{out}$, $T_{clk}$ and N. In this case, the edge transition times for the desired output waveform 260 would be at 5.4 delays, 10.8 delays, 16.2 delays, 21.6 delays, etc. To generate the closest waveform 250 to the desired waveform 260, the desired delays would be rounded to the nearest integer multiple of delays, e.g., 5 delays (d5), 11 delays (d11), 16 delays (d16), 22 delays (d22), etc. This round-off error or quantization effect causes the spurious outputs. Thus, the farther the actual selected delay is from the desired delay (i.e., the larger the round-off error) the larger the corresponding spurious signal being generated at the output.

One way known in the art of improving the spurious performance or reducing the spurious level relative to the desired output signal is to increase the number of taps in the delay line 30. This would result in the actual selected delays being closer to the desired delays (i.e., smaller round-off errors) and resulting smaller spurious signals being generated at the output. However, a limitation of this solution is that each tap that is added degrades the noise performance of the DLL and increases the complexity of the tap selection circuitry 70. In addition, although theoretically an infinite number of taps may be added, practically the number of taps possible is limited as present day technologies will not support the complex level of circuitry needed if the number of taps increases beyond a certain point, e.g., where the tap selection network switching delay approaches a 10% fraction of $T_{clk}$.

Another method known in the art for improving the spurious performance is the use of dither. However, in general, while the use of dither reduces the spurious energy at specific frequencies, it also essentially spreads this energy over a broader bandwidth thereby creating a floor of quantization noise. Thus, to decrease the spurious signal, and accordingly this wide band noise, to an acceptable level in certain applications, an unrealizable number of taps in addition to the dither would be required.

Thus, there exists a need for a DLL configuration that minimizes the level of spurious signals without requiring more taps to be added to the DLL and that further does not require the use of dither with its associated wide band noise.

BRIEF DESCRIPTION OF THE FIGURES

A preferred embodiment of the invention is now described, by way of example only, with reference to the accompanying figures in which:

FIG. 1 illustrates a simple block diagram of a prior art delay-locked loop configuration;

FIG. 2 illustrates the misalignment between the desired output signal and the output signal generated by the delay-locked loop configuration of FIG. 1;

DETAILED DESCRIPTION OF THE INVENTION

Figure 3:
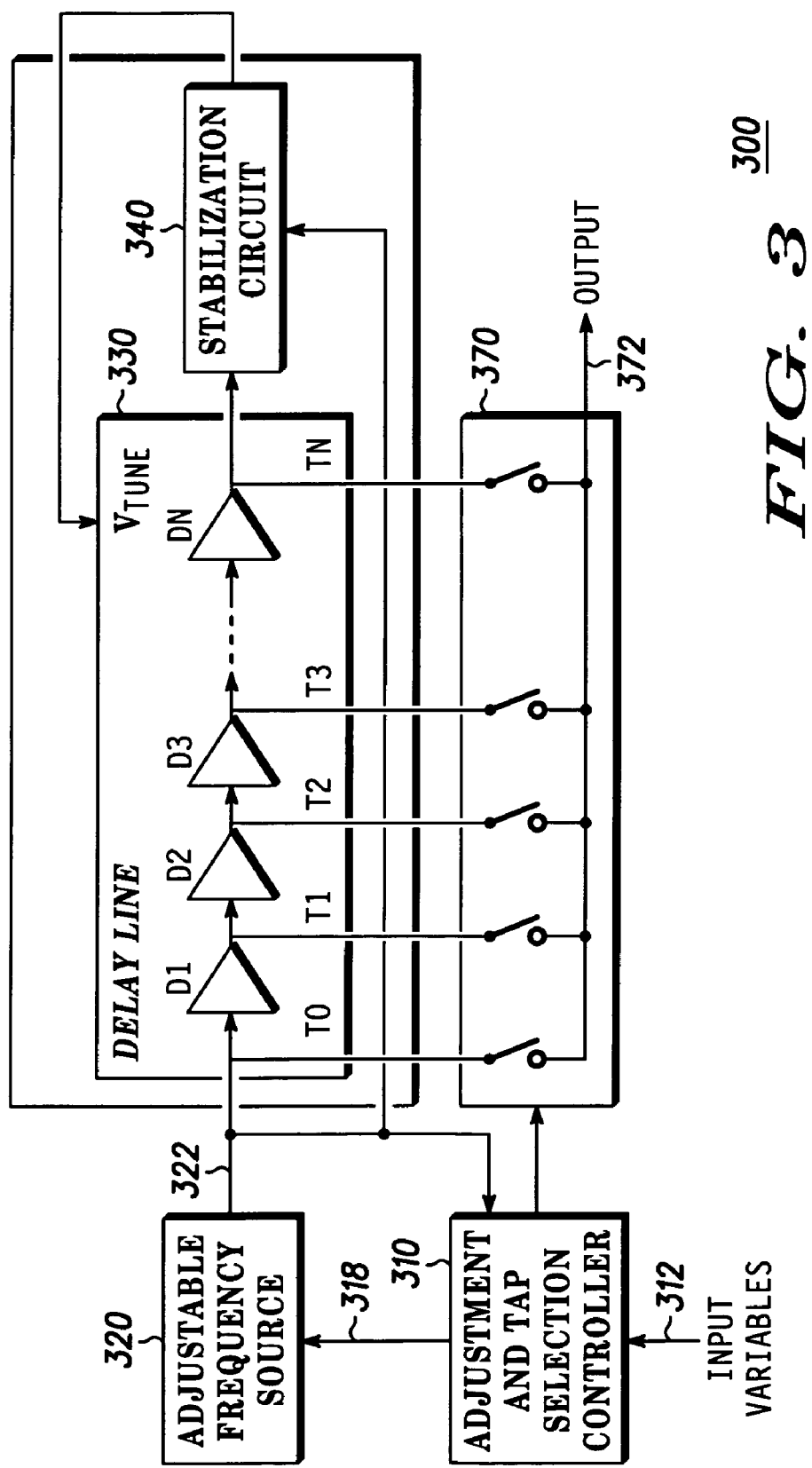
FIG. 3 illustrates a simple block diagram a of a delay-locked loop configuration in accordance with an embodiment of the present invention.

While this invention is susceptible of embodiments in many different forms, there are shown in the figures and will herein be described in detail specific embodiments, with the understanding that the present disclosure is to be considered as an example of the principles of the invention and not intended to limit the invention to the specific embodiments shown and described. Further, the terms and words used herein are not to be considered limiting, but rather merely descriptive. It will also be appreciated that for simplicity and clarity of illustration, elements shown in the figures have not necessarily been drawn to scale. For example, the dimensions of some of the elements are exaggerated relative to each other. Further, where considered appropriate, reference numerals have been repeated among the figures to indicate corresponding elements.

The present invention uses an adjustable frequency source to force the period of the output signal to be an integer number M of delays ($T_{clk}/N$), referring to equation (2). This results in the quantized edge transition times of the actual output signal corresponding with the desired edge transition times to reduce and ideally eliminate spurious signals in the output.

FIG. 3 illustrates a simple block diagram a of delay-locked loop configuration 300 in accordance with an embodiment of the present invention. DLL 300 comprises: an adjustable frequency source 320 for generating a clock signal 322 having an adjustable frequency of $F_{clkvariable}$ that is based upon at least one frequency adjustment value 318; an adjustment and tap selection controller 310 having an input for receiving one or more input variables 312 that includes an indication of the desired output frequency $F_{out}$, and may also include other variables such as, for instance, N if it has not been preprogrammed or preset into controller 310 and a range of possible frequency values for $F_{clkvariable}$; a delay line 330 having N number of adjustable delay elements D1 through DN connected in cascade and having respective output taps T0 through TN, and elements D1-DN further having an overall delay of L between two points on the delay line (typically but not necessarily between signal 322 at the input of D1 and the signal at the output of DN) that for purposes of simplifying the following discussion will equal to one, which corresponds to one wavelength, in this example of clock signal 322; and a selection circuit 370 that may be, for instance, a multiplexer (also referred to herein as a "MUX") that includes inputs coupled to taps T0 through TN.

DLL 300 may also optionally include a stabilization circuit 340 for stabilizing the delay line to substantially a predetermined desired phase shift between a signal at a first point and a signal at a second point on the delay line, which in this illustration is from the input of D1 to the output of DN. The delay line is ideally stabilized to within a range of the desired phase shift that corresponds to an acceptable spurious level at the output depending on a particular application. Stabilization circuit 340 may include, for instance, a phase detector for comparing the phase difference between the signals at the first and second points on the delay line to the predetermined desired phase shift and providing an error signal indicative of the result of the comparison, wherein the error signal is used (typically after having been smoothed, for instance, using a conventional filtering technique) to adjust the delay line to the desired predetermined delay. Stabilization 340 may further include at least one of a charge pump and a loop filter as illustrated in FIG. 1 and whose operation is well known in the art and described above.

Delay line 330 and MUX 370 may be implemented using conventional elements such as those described above by reference to FIG. 1. Thus, their operation is well known by those skilled in the art as described above by reference to FIG. 1, the details of which will not be repeated here for the sake of brevity. However controller 310 and adjustable frequency source 320 are configured in accordance with the present invention, as described in detail below, to enable $F_{clkvariable}$ to be programmed or set to eliminate or reduce spurious signals at the output 372.

Figure 4:
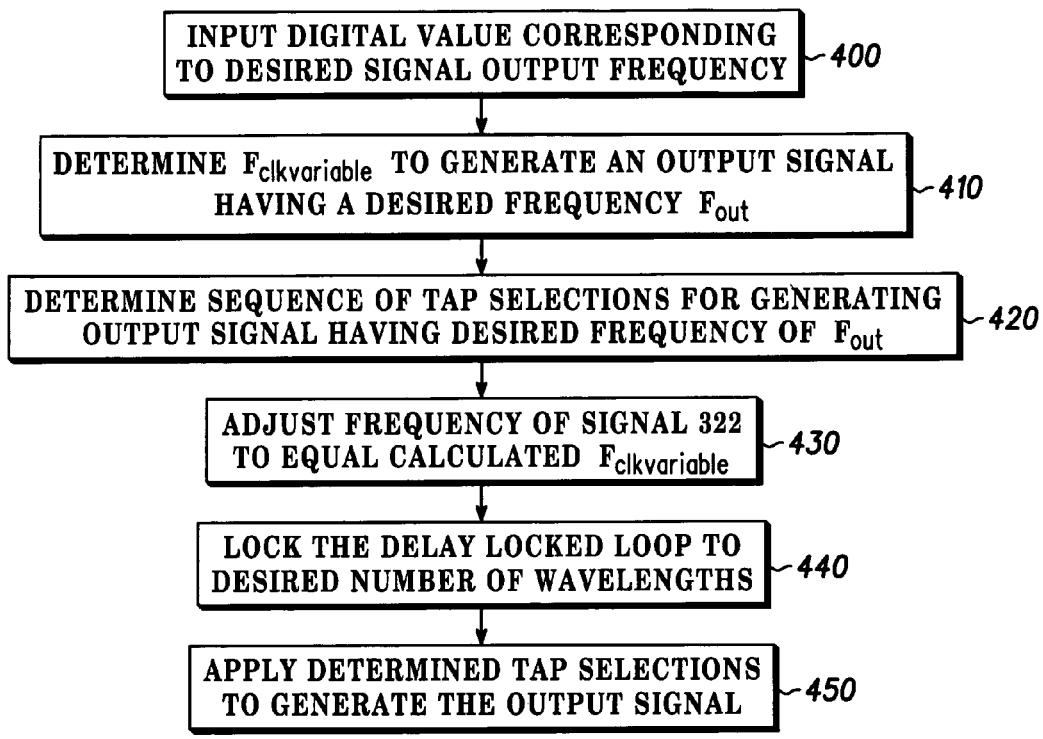
FIG. 4 illustrates a flow diagram of a method for generating an output signal in a delay-locked loop in accordance with an embodiment of the present invention.

FIG. 4 illustrates a flow diagram of a method in accordance with an embodiment of the present invention for use in a DLL (e.g., DLL 300 in FIG. 3) for generating an output signal 372. In accordance with this method, at least one input value corresponding to the desired output signal frequency $F_{out}$ is received (400) into input 312 of the adjustment and tap selection controller 310. This value may, for instance, result from a command from the device incorporating the DLL to operate at a certain frequency and is generally a digital value corresponding to $F_{out}$. Upon receipt of this digital value, the adjustment and tap selection controller 310 determines (410) an $F_{clkvariable}$ that would generate an output signal having the same or substantially the same frequency as the desired $F_{out}$, to a typical frequency tolerance of 1 ppm to 10 ppm (parts per million). In other words an output signal would be generated that eliminates or at least minimizes quantization effect spurious signals at the output to the extent possible, given, for instance, any other limitations in the circuit such as, for instance, a mismatch in the delay elements or other such limitations known in the art. $F_{clkvariable}$ may be computed based upon, for instance, iteratively applying equation (1) and (2) to determine an $F_{clkvariable}$/$F_{out}$ ratio that corresponds to the ratio of M/N, thereby forcing the output period to be an integer number M of delays.

For the computed $F_{clkvariable}$ and M, the adjustment and tap selection controller 310 may determine (420), in accordance with the present invention, a sequence of tap selection values and corresponding phase-shifted clock signals to be selected one at a time for generating the desired output signal. This sequence of tap selection values may include all of the available tap selection values corresponding to the available phase-shifted clock signals or alternatively may include only a portion thereof. The adjustable frequency source 320 may then adjust the clock signal 322 (430), under the control or direction of the adjustment and tap selection controller 310, such that signal 322 has substantially the frequency $F_{clkvariable}$ that was computed by controller 310. This causes delay line 330 to be locked (440) to the desired phase shift, e.g., the desired wavelengths L of clock signal 322. When the delay line is locked, the tap selections determined by the adjustment and tap selection controller 310 can be applied (450) by MUX 370 to generate an output signal 372 having substantially the desired output frequency, i.e., wherein the frequency of waveform 250 is substantially equal to the frequency of waveform 260.

In this case, the delay line is locked to one wavelength such that L=1. However, those of ordinary skill in the art will realize that L may be set to another value such that the delay line is locked to, for instance, a half-wavelength or a quarter-wavelength. In the case where L is not equal to one, a data bus line may be connected from the controller 310 to the delay line or, for instance, to a phase detector in the stabilization circuit 340 for adjusting the delay line to the desired phase shift.

Following is a detailed description of embodiments of the adjustment and tap selection controller 310 and the adjustable frequency source 320 that would enable the method of FIG. 4 to be implemented in a DLL configuration such as DLL 300. In accordance with the present invention, generation of the programmable clock signal 322 may, for instance, be implemented using a frequency synthesizer such as, for instance, a conventional fractional-N phase-locked loop having at least one input variable that is based on $F_{clkvariable}$ and that is determined by the adjustment and tap selection controller 310. Adjustable frequency source 320 is hereinafter interchangeably referred to as adjustable frequency synthesizer (320) but without any intention of limiting the frequency source (320) to the specific frequency synthesizer implementation.

The signal output 322 from synthesizer 320 will typically have a frequency $F_{clkvariable}$ that may vary from a minimum frequency $F_{min}$ to a maximum frequency $F_{max}$. To determine this variance, let us assume for the moment that $F_{clkvariable}$ is fixed similar to the frequency $F_{clk}$ of signal 22 of FIG. 1, wherein, $$F_{min} = F_{fixed} - \Delta F_1, \text{ and} \quad (3)$$

$$F_{max} = F_{fixed} + \Delta F_2, \quad (4)$$

where $F_{fixed}$ is assumed fixed frequency, and where generally $\Delta F_1 = \Delta F_2$.

The following analysis explains how much synthesizer 320 is ideally configured to vary. Consider equation (5) for a system that uses a fixed frequency synthesizer for a delay-locked loop as denoted by $F_{fixed}$ as shown below:

$$F_{fixed} = \frac{M \times F_{out}}{N} \quad (5)$$

Using this relationship:

$$M = \frac{F_{fixed} \times N}{F_{out}} \quad (6)$$

However, for some desired output frequencies $F_{out}$ and a given $F_{fixed}$, there will be frequencies that cannot be satisfied by using integer values for M. This is shown below by adding the error ε to the integer M:

$$M + \varepsilon = \frac{F_{fixed} \times N}{F_{out}} \quad (7)$$

In order to insure that all cases can be satisfied for a given frequency band, a frequency source is used that can be varied over a limited frequency range. The frequency required to eliminate the error of E introduced above can be found by:

$$F_{clkvariable} = F_{fixed} + \Delta F \quad (8)$$
$$= \frac{(M \pm \varepsilon) \times F_{out}}{N}$$
$$= \frac{M \times F_{out}}{N} \pm \frac{\varepsilon \times F_{out}}{N}$$

In this scenario, the frequency is either increased or decreased to reach the nearest integer M. Therefore, $\varepsilon \leq \frac{1}{2}$.

The amount of variability needed for the frequency source (not including what is needed for temperature or supply variation) is as follows:

$$\frac{\Delta F}{F_{fixed}} = \frac{\left(\frac{\varepsilon \times F_{out}}{N}\right)}{\left(\frac{M \times F_{out}}{N}\right)} = \pm \frac{\varepsilon}{M} \quad (9)$$

The worst case would be for the lowest M. In the case of a 32 tap delay line (N=32), M≧N, so the worst case M would be 33 (assuming that you would not want to regenerate the reference frequency). Therefore, the maximum variation would be:

$$\pm \frac{\varepsilon}{M} = \pm \frac{\left(\frac{1}{2}\right)}{33} = \pm 0.0152 \quad (10)$$

or ±1.52%, which would equate to a total variation of 3.04%. This is a limited frequency range that is very small compared to the available frequency variablily of the signal at output 372, wich can span at least one decade of frequency.

This relationship can be extended to find the worst case variation in the adjustable synthesizer for a delay line of any number of elements. As noted above, the worst case would be when M is one more than the number of taps and when $\varepsilon \leq \frac{1}{2}$.

Therefore, the worst case variation required to optimize the spurious performance for an N tap delay line would be:

$$\frac{\Delta F}{F_{fixed}}(worstcase) = \frac{\frac{1}{2}}{N+1} = \frac{1}{2N+2} \quad (11)$$

This means that for a 64 tap delay line (note that the number of delay elements or taps in a delay line does not necessarily need to be a power of 2) the worst case variation required of the variable frequency source is ±0.8% or a total variation of 1.6%. This is half the total variation needed as compared to that needed for a 32 tap line, which as determined above required a 3.04% total variation.

Figure 5:
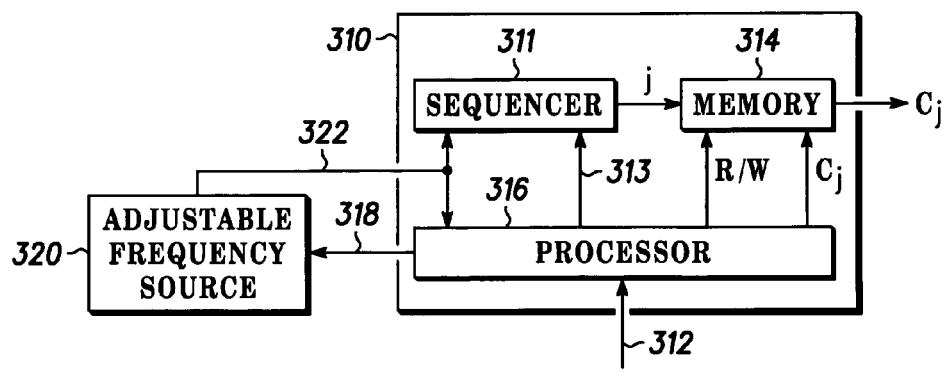
FIG. 5 illustrates a simple block diagram of an embodiment of an adjustment and tap selection controller in accordance with the present invention.

FIG. 5 illustrates a block diagram of an embodiment of an adjustment and tap selection controller 310 in accordance with the present invention shown coupled to the adjustable frequency source 320. Tap selection controller 310 includes a processor 316 that is configured for processing an algorithm in hardware or one that is stored in a memory as software for determining $F_{clkvariable}$ for a desired frequency $F_{out}$ and for outputting at least one frequency adjustment value 318 to frequency source 320 such that it adjusts the frequency of clock signal 322 to substantially $F_{clkvariable}$. Processing device 316 further determines a sequence of selection values, $C_j$, corresponding to a sequence of phase-shifted clock signals and outputs to the MUX 370 the sequence of selection values such that MUX 370 selects the corresponding sequence of phase-shifted clock signals one at a time to generate output signal 372. Processor 316 is ideally a digital signal processor.

Adjustment and tap selection controller 310 may also, optionally, include a memory element 314 for storing the sequence of selection values and for outputting the sequence to MUX 370, and a sequencer 311 for controlling the timing of the output of the sequence of selection values from the memory element 314. Sequencer 311 may be, for instance, any suitable counter for controlling the timing of the output of the sequence of selection values based upon the clock signal 322, as illustrated in FIG. 5, and memory element 314 may be, for instance, a read only memory.

With the elimination of quantization effect in the digital-to-phase converter process, a predetermined sequence of tap selections can be managed with the reduced digital processing architecture of a processor or a processor in combination with sequencer 311 and memory element 314 as illustrated in FIG. 5. Accordingly, the digital processing can be reduced to counting the input clock cycles and sequencing through a predetermined set of tap selection values $C_j$. This can be reduced to a simple operation of incrementing through a set of memory addresses containing the corresponding tap selection values, where the address increment also corresponds to a given clock frequency $F_{clkvariable}$. A more detailed explanation of the operation of controller 310 follows.

Processor 316 receives as inputs the programming variables 312 that are necessary to calculate the programming values for the adjustable frequency synthesizer 320, the memory 314, and counter 311. The input variables would be those that are necessary to solve equation 1. For example, the device into which the invention is incorporated, such as a portable communications device, might program into processor 316 the desired output frequency ($F_{out}$) the number of taps (N) that are present in the delay line (330 of FIG. 3), and the frequency range ($F_{min} < F_{clk} < F_{max}$) of the adjustable frequency synthesizer 320. Based on these inputs, the processor 316 would use equation 1 to solve for M or a range of M values that would satisfy the equation, wherein M is an integer so as to provide the most reduction in spurious outputs. An M value would be selected from the solution set and would then be used to calculate an $F_{clkvariable}$ value that would correspond with the desired output frequency ($F_{out}$), the M value calculated above, and the given number of taps used in the delay line.

Once the desired $F_{clkvariable}$ is calculated, the programming variables 318 necessary for realizing the required clock input to the delay line 330 would be written to the adjustable frequency synthesizer 320. The processor 316 could then calculate the tap selection sequence needed to create the desired output frequency ($F_{out}$) and generate the corresponding tap selection values to load into memory 314. These tap selection values are referred to in FIG. 5 as $C_j$, where j corresponds with the address of the memory location in which the tap selection value is stored. For the sake of simplicity, $C_j$ will be a tap address (ie. $C_j=0$ would correspond with tap 0, $C_j=1$ would correspond with tap 1, etc.). However, in the actual implementation the tap selection values written to memory might be a bit sequence, each bit corresponding with a tap selector in MUX 370 (for example, for a 4 element delay line a value of 1000 in memory 314 would connect tap 0 to the output in MUX 370, a value of 0100 would connect tap 1 with the output, etc.).

For the embodiment of FIG. 5, the contents of a memory address j is output to MUX 370 for every cycle of the adjustable frequency synthesizer output clock 322. Depending on the ratio of the clock frequency to the desired output frequency ($F_{clkvariable}/F_{out}$), an output transition may not be needed for a given period of the clock 322. Therefore, some memory addresses will contain a null value so as not to enable a tap during that particular clock cycle. Given this, the tap selection values that are stored in memory 314 are calculated as follows:

1. Designate the sequence to begin with one of the taps. For simplicity, the sequence may begin with the first tap, $T_0$. Therefore, the first $C_j$ value to be stored in memory would the address of $T_0$, or $C_0=0$.
2. Determine whether or not a tap is required in the next clock cycle using the following equation:

$$x_j = \left\lfloor Trunc\left(\frac{M+C_j}{N}\right)\right\rfloor - 1 \quad (12)$$

where $x_j$ determines the number of clock cycles following the cycle corresponding to $C_j$ that do not contain an output cycle. For each skipped clock cycle, a null value is programmed into the corresponding address of memory 314. Note here that the Trunc operation removes the fractional portion of the number resulting from the expression in parenthesis. For example, if $$\frac{M+C_j}{N} = 3.9$$

then Trunc(3.9) would evaluate to the integer value of 3.

3. Once the required number of skipped clock cycles is determined and programmed, the tap to be selected in the next clock cycle is calculated using the following:

$$C_{j+1} = Mod\left[\{C_{jvalid} + Mod(M,N)\}, N\right] \quad (13)$$

where Mod refers to the Modulus function as defined below: Mod[n,m]=n modulus m=integer remainder of n/m. For example, Mod[33,32]=1, Mod[32,32]=0, Mod[17,8]=1. Note that in equation (13) above, the $C_{jvalid}$ would refer to the last valid $C_j$ value (not including a null value). Therefore, if when calculating the next tap selection value the current value in address j is null, the previous value for $C_j$ would be used (ie., $C_{j-1}$). If $C_{j-1}$ is a null value, then the prior value would be used ($C_{j-2}$). This process continues until a valid tap selection value is obtained ($C_{jvalid}$) and this value is used.

4. Steps 2 and 3 are repeated until the required number of tap selection values are derived. Note that the maximum number of taps in a sequence is M (including null values representing skipped clock cycles). However, if M is a multiple of Mod[M,N], then the tap sequence can be reduced to {N/(Mod[M,N])} plus the number of skipped clock cycles.

As an example, consider a 4 tap delay line (N=4) and a value of M of 5, which means that M/N=5/4=1.25, and Mod[M,N] is 1. Therefore, the tap addresses ($C_j$) could be calculated as shown in the following table:

| j | $C_j$ | $C_{j+1}$ | $x_j$ |
|---|---|---|---|
| 0 | 0 | $C_{j+1}$ = Mod[{0 + Mod(5,4)},4] = Mod[1,4] = 1 | $\left\lfloor Trunc\left(\frac{5+0}{4}\right)\right\rfloor - 1 = 0$ |
| 1 | 1 | $C_{j+1}$ = Mod[{1 + Mod(5,4)},4] = Mod[2,4] = 2 | $\left\lfloor Trunc\left(\frac{5+1}{4}\right)\right\rfloor - 1 = 0$ |
| 2 | 2 | $C_{j+1}$ = Mod[{2 + Mod(5,4)},4] = Mod[3,4] = 3 | $\left\lfloor Trunc\left(\frac{5+2}{4}\right)\right\rfloor - 1 = 0$ |
| 3 | 3 | null ($x_3$ = 1) | $\left\lfloor Trunc\left(\frac{5+3}{4}\right)\right\rfloor - 1 = 1$ |
| 4 | null | $C_{j+1}$ = Mod[{3 + Mod(5,4)},4] = Mod[4,4] = 0 (use last valid $C_j$ which was $C_3$ = 3) | ($X_j$ not calculated for skipped clock cycles) |
| 0 | 0 (repeat) | 1 | 0 |

Processor 316 controls counter 311 through control line 313 in order to program the counter for the calculated number of addresses loaded into memory 314. Counter 311 is then driven by the adjustable frequency synthesizer output 322 so as to count cycles of the clock signal that is applied to the input of delay line 330 for synchronization of the delay line with the tap selection process. Counter 311, thus, provides control to memory 314 to determine which memory location is actively being read by MUX 370.

Therefore, once the adjustable frequency synthesizer 320 has reached the programmed frequency $F_{clkvariable}$ determined by controller 310 and the memory 314 and counter 311 have been loaded and configured for the desired output frequency ($F_{out}$), the counter 311 runs and steps through the locations in memory 314. The memory 314 in turn outputs the tap selection values to the MUX 370 at the proper time in order to multiplex the delayed clock signal to the output so as to form the desired output signal.

Figure 6:
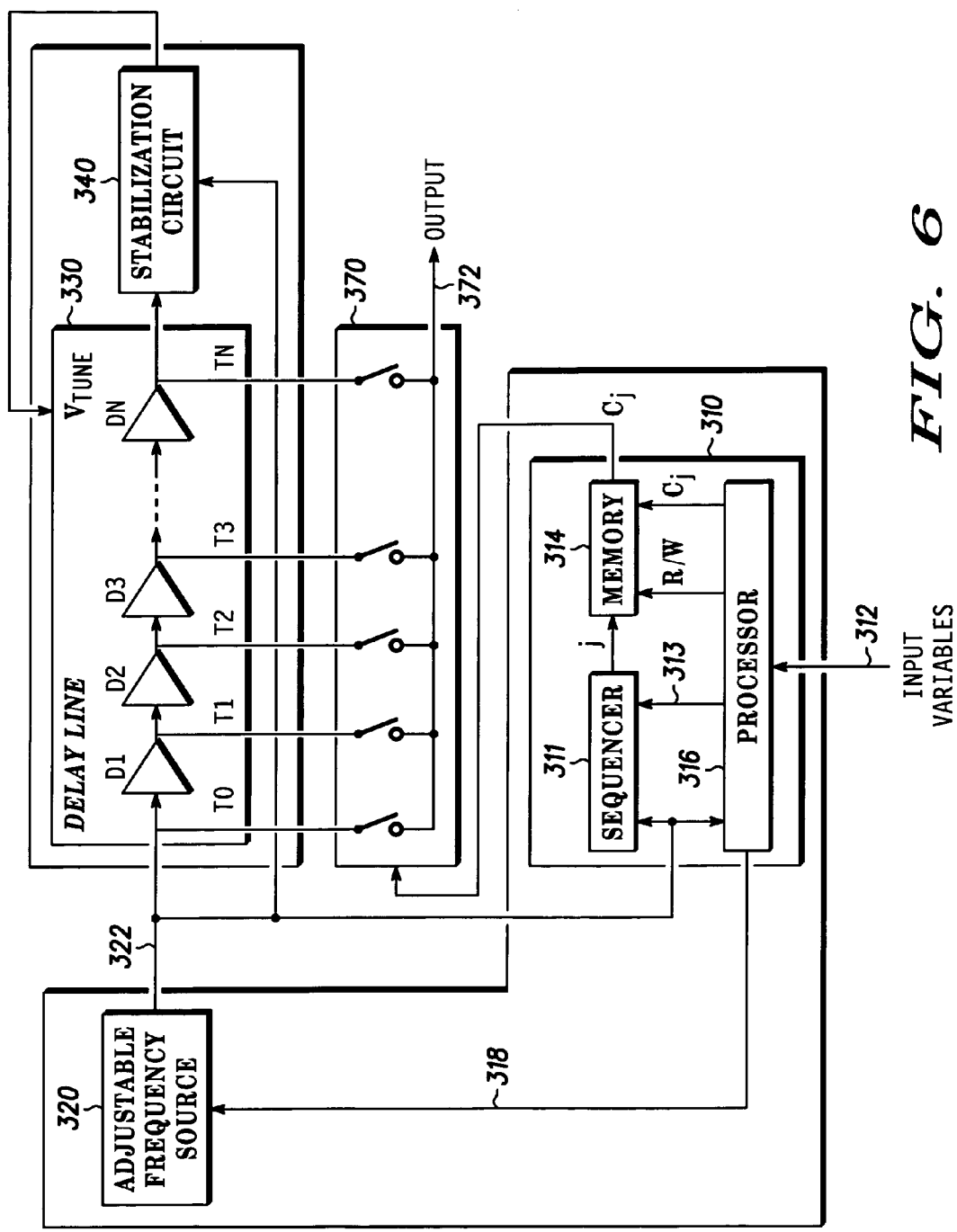
FIG. 6 illustrates a simple block diagram of a delay-locked loop configuration in accordance with another embodiment of the present invention.

FIG. 6 illustrates a simple block diagram of a delay-locked loop configuration in accordance with an embodiment of the present invention showing an expanded controller 310 configuration. FIG. 6 includes each of the elements of the embodiment illustrated in FIG. 3, the details of which will not be repeated here for the sake of brevity. FIG. 6 further includes the expanded illustration of adjustment and tap selection controller 310 that is shown in FIG. 5, the details also of which will not be repeated here for the sake of brevity. However, what can be further seen by the embodiment in FIG. 3 is the connectivity of the outputs from controller 310 to the adjustable frequency synthesizer 320 and MUX 370. Specifically, the adjustable frequency programming value(s) 318 are input into synthesizer 320 to program it for generating the clock signal 322 having the frequency $F_{clkvariable}$ determined by controller 310. In addition, the tap selection values $C_j$ are coupled to the MUX 370 for controlling the MUX to select the correct taps in the correct sequence and with the correct timing in order to generate the output signal 372 having the desired output frequency $F_{out}$.

Figure 7:
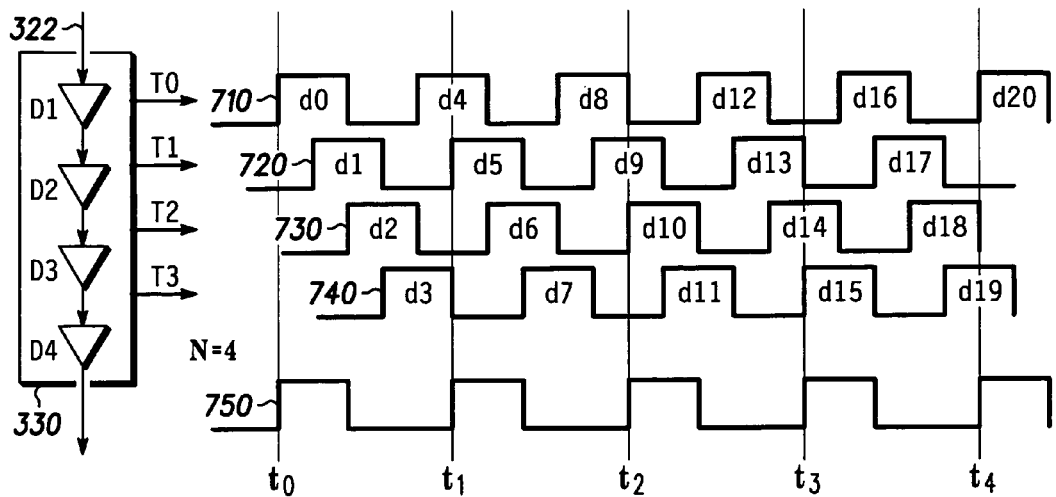
FIG. 7 illustrates the alignment of the desired output signal when spurious signals are reduced in accordance with the present invention.

FIG. 7 illustrates the alignment of the desired output signal when spurious signals are reduced in accordance with the present invention. Let us assume that delay line 330 includes four delay elements D1 through D4. FIG. 7, accordingly, illustrates clock signal 322 (i.e., waveform 710 having no delay or a zero phase shift) and three corresponding time delayed or phase-shifted clock signals (i.e., waveforms 720, 730 and 740) output therefrom. Assuming a total delay from D1 to D4 of one wavelength, the waveform output from D4 would be equivalent to waveform 710. As FIG. 7 illustrates, each waveform ideally has the same frequency but a different delay in time. Moreover, in this illustration from a time $t_0$ to a time $t_4$, twenty-one edge transition times or delay times (i.e., d0 through d20) are generated from which MUX 370 can select to generate the desired output waveform 760. Assume that the present invention forces M=5, for example, for a given $T_{out}$, $T_{clk}$ and N. In this case, the edge transition times for the desired output waveform 760 would be at 5 delays, 10 delays, 15 delays, 20 delays, etc., which are each an integer multiple of delays. Thus controller 310 could direct MUX 370 to selects delays d5, d10, d15, d20, etc. to generate a waveform 750 that has the desired frequency.

Figure 8:
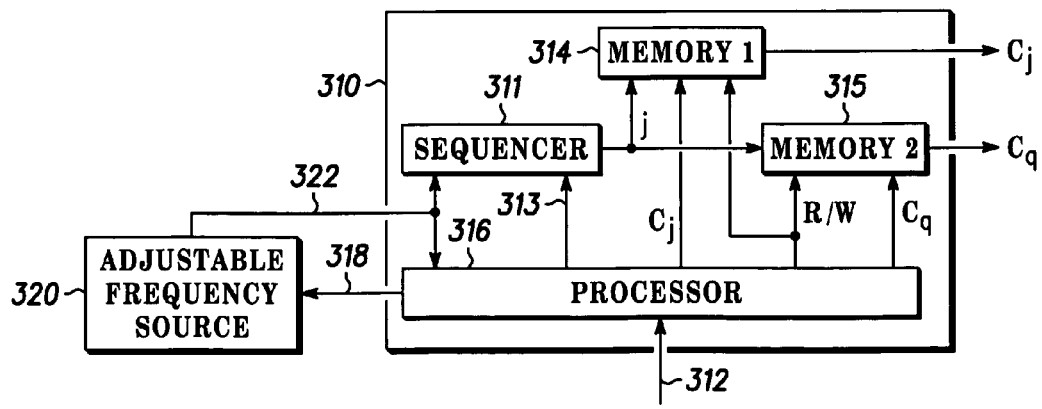
FIG. 8 illustrates a simple block diagram of another embodiment of an adjustment and tap selection controller in accordance with the present invention.

FIG. 8 illustrates a simple block diagram of another embodiment of an adjustment and tap selection controller 310 in accordance with the present invention. FIG. 8 includes each of the elements of the embodiment illustrated in FIG. 5, the details of which will not be repeated here for the sake of brevity. FIG. 8 further includes a second memory element 315, which is ideally identical to RAM memory element 314 for storing a second set of tap selection values, e.g., $C_q$, that may be used to generate a second output signal having substantially the same frequency as signal 372 but is shifted in phase. Thus, the same process that was outlined above to derive the $C_j$ tap selection values corresponding with the embodiment of FIG. 5 could be used to derive the $C_j$ tap selection values for the embodiment of FIG. 8. In addition, the $C_q$ values could be determined by shifting the $C_j$ values by an amount that corresponds to the shift in phase between the two signals.

Those of ordinary skill in the art will realize that controller 310 may be implemented as a processor, alone, having the same functionality as the stand-alone processor described above by reference to FIG. 5, but having the additional functionality of determining a second sequence of selection values, $C_q$, corresponding to a second sequence of phase-shifted clock signals for generating the second output signal. Those of ordinary skill in the art will further realize that controller 310 may contain additional memory elements storing corresponding tap selection values for generating additional output signals having essentially the same frequency but shifted in phase from output signal 372. Moreover, although memory elements 314 and 315 are shown, for illustrative purposes, as separate boxes, this is not meant to imply that they must be separate elements. For example, a single memory device may be used, such as a single random access memory, for accomplishing the functionality of these memory elements. The number of additional output signals is limited by the loading restrictions on the delay line network.

In accordance with the embodiment of controller 310 illustrated in FIG. 8, a common DLL system may be shared, for instance, for the generation of a set of quadrature signals, wherein the two output signals generated differ in phase by substantially ninety degrees. Quadrature signals are a set of phase coherent signals used in image rejection frequency translation signal processing found, for example, in wireless communications equipment and thereby associated with wireless signal processing. Quadrature may be defined, in this instance, as two signals being offset by a time value equal to $1/(4*F_{out})$. Accordingly, tap selection values, $C_q$, may be determined by the following equation:

$$C_q = \text{Mod}\left[\left(C_j + \frac{M}{4}\right), N\right] \tag{14}$$

wherein the $C_q$ tap selection values are generated by shifting the $C_j$ values by M/4.

The following example illustrates the process of calculating the tap selection values for the above quadrature embodiment. Consider a delay locked loop containing a delay line 330 having 8 taps (N=8). The desired ratio of Fclk/Fout is 1.5, so that the M of this example would be 12. The $C_j$ tap selection values can be calculated using equations 12 and 13 above, and the $C_q$ tap selection values can be calculated using equation 14 above. In this example, the $C_q$ tap selection values are determined by shifting $C_j$ by M/4=12/4=3. The table below illustrates the calculated $C_j$ and $C_q$ tap selection values:

| j | $C_j$ | $C_q$ | $C_{j+1}$ | $x_j$ |
|---|---|---|---|---|
| 0 | 0 | 3 | $C_{j+1} = \text{Mod}[\{0 + \text{Mod}(12,8)\},8] = 4$ | $\left[\text{Trunc}\left(\frac{12+0}{8}\right)\right] - 1 = 0$ |
| 1 | 4 | 7 | null ($x_1 = 1$) | $\left[\text{Trunc}\left(\frac{12+4}{8}\right)\right] - 1 = 1$ |
| 2 | null | null | $C_{j+1} = \text{Mod}[\{4 + \text{Mod}(12,8)\},8] = 0$ | |
| 0 | 0 (repeat) | 3 | 4 | $\left[\text{Trunc}\left(\frac{12+0}{8}\right)\right] - 1 = 0$ |

Figure 9:
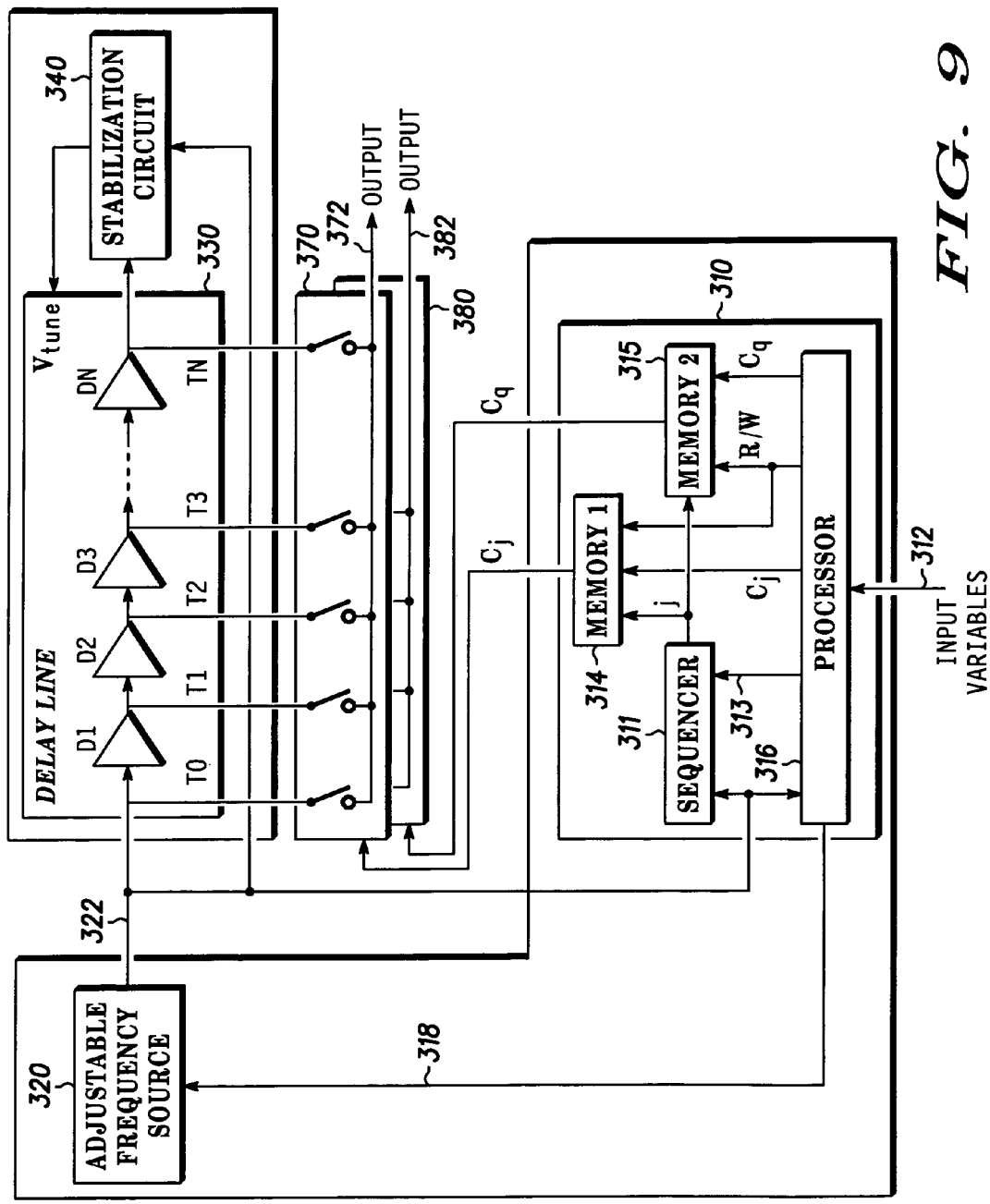
FIG. 9 illustrates a simple block diagram a of delay-locked loop configuration in accordance with another embodiment of the present invention.

Thus, the elimination of quantization effect for a set of quadrature signal generation, may be accomplished by restricting M to a binary number and adding a second tap selection network to DLL 300 as shown in FIG. 9. These secondary tap selection values may then be applied to the second tap selection network that has a separate output signal that is ideally at the same frequency as the output signal from the tap selection network (i.e. MUX 370) driven with $C_j$.

FIG. 9 illustrates a simple block diagram a of delay-locked loop configuration in accordance with another embodiment of the present invention showing an expanded controller 310 configuration. FIG. 9 includes each of the elements of the embodiment illustrated in FIG. 6, the details of which will not be repeated here for the sake of brevity. FIG. 9 further includes a second tap selection circuit 380, that is ideally identical to MUX 370, and that generates an output signal 382. FIG. 9 further includes the expanded illustration of the adjustment and tap selection controller 310 that is shown in FIG. 8, the details also of which will not be repeated here for the sake of brevity. However, what can be further seen by the embodiment in FIG. 9 is the connectivity of the tap selection values $C_q$ being coupled to the MUX 380 for controlling the MUX to select the correct taps in the correct sequence and with the correct timing in order to generate the output signal 382 having desired output frequency, e.g., $F_{out}$. This embodiment may, for instance, be used for a set of quadrature signal generation as described above by reference to FIG. 8.

While the invention has been described in conjunction with specific embodiments thereof, additional advantages and modifications will readily occur to those skilled in the art. The invention, in its broader aspects, is therefore not limited to the specific details, representative apparatus, and illustrative examples shown and described. Various alterations, modifications and variations will be apparent to those skilled in the art in light of the foregoing description. For instance, DLL of the present invention may include additional controllers 310 and additional MUXs 370 as described above to generate a plurality of output signals having different desired frequencies. Thus, it should be understood that the invention is not limited by the foregoing description, but embraces all such alterations, modifications and variations in accordance with the spirit and scope of the appended claims.

What is claimed is:

1. A delay-locked loop (DLL) comprising:

an adjustable frequency source for generating a clock signal having a frequency that can be adjusted to one of at least two different frequencies;

an adjustment and tap selection controller for determining a first frequency as a function of a second frequency and for causing said frequency source to adjust the frequency of said clock signal to substantially said first frequency, said second frequency being the desired frequency of a first output signal;

a delay line configured to receive the clock signal for generating a plurality of phase-shifted clock signals, each phase-shifted clock signal having substantially said first frequency and being shifted in phase with respect to the clock signal and with respect to the other phase-shifted clock signals; and a first selection circuit for receiving the plurality of phase-shifted clock signals and for selecting, one at a time and under the control of the adjustment and tap selection controller, a first sequence of the phase-shifted clock signals for generating said first output signal having substantially said second frequency.

2. The DLL of claim 1, wherein the delay line comprises a plurality of delay elements connected in cascade for generating said plurality of phase-shifted clock signals.

3. The DLL of claim 1, wherein said selection circuit is a multiplexer.

4. The DLL of claim 1 farther comprising a stabilization circuit for stabilizing the delay line to substantially a predetermined desired phase-shift between a signal at a first point and a signal at a second point on the delay line.

5. The DLL of claim 4, wherein said first point is an input to a first delay element in said delay line, and said second point is an output of a last delay element in said delay line.

6. The DLL of claim 4, wherein said stabilization circuit includes a phase detector for comparing the phase difference between the signals at said first point and said second point to said predetermined desired phase shift and providing an error signal indicative of the result of said comparison.

7. The DLL of claim 6, wherein said error signal is used to adjust the delay line to substantially the predetermined desired phase shift.

8. The DLL of claim 1, wherein said adjustable frequency source is a frequency synthesizer.

9. The DLL of claim 8, wherein said frequency synthesizer is a fractional-N synthesizer.

10. The DLL of claim 1, wherein said adjustment and selection controller includes a processing device, whereby said processing device determines said first frequency and outputs at least one frequency adjustment value to said adjustable frequency source such that it adjusts the frequency of said clock signal to substantially said first frequency, and said processing device further determines a first sequence of selection values corresponding to said first sequence of phase-shifted clock signals and outputs to said first selection circuit the first sequence of selection values such that the first selection circuit selects the corresponding first sequence of phase-shifted clock signals to generate said first output signal.

11. The DLL of claim 10, wherein said processing device is a digital signal processor.

12. The DLL of claim 10, wherein said adjustment and selection controller further comprises:
a memory element coupled to said processing device for storing said first sequence of selection values and for outputting said first sequence to said first selection circuit; and
a sequencer coupled to said memory element and said processing device for controlling the timing of the output of said first sequence of selection values from said memory element.

13. The DLL of claim 12, wherein said memory element is a random access memory.

14. The DLL of claim 12, wherein said sequencer is a counter that is further coupled to said adjustable frequency source to receive said clock signal for controlling the timing of the output of said first sequence of selection values based on said clock signal.

15. The DLL of claim 1 further comprising at least a second selection circuit for receiving the plurality of phase-shifted clock signals and for selecting, one at a time and wider the control of the adjustment and tap selection controller, a second sequence of the phase-shifted clock signals for generating a second output signal.

16. The DLL of claim 15, wherein said second output signal has a frequency that is substantially the same as said second frequency.

17. The DLL of claim 16, wherein said first and second output signals differ in phase by substantially ninety degrees.

18. The DLL of claim 15, wherein said adjustment and selection controller includes a processing device, whereby said processing device determines said first frequency and outputs at least one frequency adjustment value to said adjustable frequency source such that it adjusts the frequency of said clock signal to substantially said first frequency, and said processing device further determines a first sequence of selection values corresponding to said first sequence of phase-shifted clock signals and outputs to said first selection circuit the first sequence of selection values such that the first selection circuit selects the corresponding first sequence of phase-shifted clock signals to generate said first output signal, and said processing device further determines a second sequence of selection values corresponding to said second sequence of phase-shifted clock signals and outputs to said second selection circuit the second sequence of selection values such that the second selection circuit selects the corresponding second sequence of phase-shifted clock signals to generate said second output signal.

19. The DLL of claim 18, wherein said adjustment and selection controller further comprises:
a first memory clement coupled to said processing device for storing said first sequence of selection values and for outputting said first sequence to said first selection circuit;
a second memory element coupled to said processing device for storing said second sequence of selection values and for outputting said second sequence to said second selection circuit; and
a sequencer coupled to said first and second memory elements and to said processing device for controlling the timing of the output of said first sequence of selection values from said first memory element and the output of said second sequence of selection values from said second memory element.

20. A method for use in a delay locked loop, said method comprising the steps of:
determining a first frequency as a function of a second frequency, said second frequency being the desired frequency of a first output signal;
outputting at least one frequency adjustment value for causing a clock signal, having a frequency that can be adjusted to one of at least two different frequencies, to be generated having substantially said first frequency and for further causing a plurality of phase-shifted clock signals to be generated, each phase-shifted clock signal having substantially said first frequency and being shifted in phase with respect to the clock signal and with respect to the other phase-shifted clock signals;
determining a first sequence of selection values corresponding to a first sequence of the plurality of phase-shifted clock signals; and
outputting said first sequence of selection values for causing said first sequence of phase-shifted clock signals to be selected one at a tune for generating said first output signal having substantially said second frequency.

21. The method of claim 20 further comprising the steps of:
determining at least a second sequence of selection values corresponding to a second sequence of the plurality of phase-shifted clock signals; and
outputting said second sequence of selection values for causing said second sequence of phase-shifted clock signals to be selected one at a time for generating a second output signal.

22. A method for use in a delay-locked loop, said method comprising the steps of:
determining a first frequency as a function of a second frequency, said second frequency being the desired frequency of a first output signal;
adjusting to substantially said first frequency a frequency of a clock signal that can be adjusted to one of at least two different frequencies;
generating a plurality of phase-shifted clock signals, each phase-shifted clock signal having substantially said first frequency and being shifted in phase with respect to the clock signal and with respect to the other phase-shifted clock signals;
determining a fast sequence of selection values corresponding to a first sequence of the plurality of phase-shifted clock signals; and selecting, one at a time and based on said first sequence of selection values, said first sequence of phase-shifted clock signals, for generating said first output signal having substantially said second frequency.

23. The method of claim 22 further comprising the steps of:
determining a second sequence of selection values corresponding to a second sequence of the plurality of phase-shifted clock signals; and
selecting, one at a time and based on said second sequence of selection values, said second sequence of phase-shifted clock signals, for generating a second output signal.

* * * * *

UNITED STATES PATENT AND TRADEMARK OFFICE
CERTIFICATE OF CORRECTION

| | | |
|---|---|---|
| PATENT NO. | : 7,109,766 B2 | |
| APPLICATION NO. | : 10/830337 | |
| DATED | : September 19, 2006 | |
| INVENTOR(S) | : Wilhite et al. | |

It is certified that error appears in the above-identified patent and that said Letters Patent is hereby corrected as shown below:

TITLE PAGE:

At the top of page, beneath line (12), delete "White, et al." and insert therefor --Wilhite, et al.--.

At (75) Inventors:, delete "Jeffrey B. White" and insert therefor --Jeffrey B. Wilhite--.

Signed and Sealed this
Eleventh Day of September, 2012

David J. Kappos
*Director of the United States Patent and Trademark Office*